United States Patent
Chen et al.

(10) Patent No.: US 11,828,790 B2
(45) Date of Patent: Nov. 28, 2023

(54) CIRCUIT TEST STRUCTURE AND METHOD OF USING

(71) Applicant: TAIWAN SEMICONDUCTOR MANUFACTURING COMPANY, LTD., Hsinchu (TW)

(72) Inventors: Ching-Fang Chen, Hsinchu (TW); Hsiang-Tai Lu, Hsinchu (TW); Chih-Hsien Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 101 days.

(21) Appl. No.: 17/229,269

(22) Filed: Apr. 13, 2021

(65) Prior Publication Data

US 2021/0231730 A1    Jul. 29, 2021

Related U.S. Application Data

(60) Continuation of application No. 16/401,850, filed on May 2, 2019, now Pat. No. 11,002,788, which is a
(Continued)

(51) Int. Cl.
*H01L 23/00*    (2006.01)
*H01L 23/12*    (2006.01)
(Continued)

(52) U.S. Cl.
CPC ..... *G01R 31/2856* (2013.01); *G01R 31/2886* (2013.01); *H01L 22/34* (2013.01); *H01L 23/12* (2013.01); *H01L 23/49827* (2013.01); *H01L 24/16* (2013.01); *H01L 2224/13099* (2013.01); *H01L 2224/13111* (2013.01); *H01L 2224/13147* (2013.01); *H01L 2224/16225* (2013.01); *H01L 2224/16227* (2013.01)

(58) Field of Classification Search
CPC ... H01L 23/12; H01L 23/49827; H01L 24/16; H01L 22/34; H01L 2224/13099; H01L 2224/13111; H01L 2224/13147; H01L 2224/16225; H01L 2224/16227
USPC ......................................................... 257/48
See application file for complete search history.

(56) References Cited

U.S. PATENT DOCUMENTS 6,022,750 A    2/2000 Akram et al.
6,362,638 B1   3/2002 Ashton et al.
(Continued)

FOREIGN PATENT DOCUMENTS

JP    2004221372    8/2004

OTHER PUBLICATIONS

Notice of Allowance dated Jan. 29, 2014 and English translation from corresponding application No. KR 10-2012-0036962.

*Primary Examiner* — Igwe U Anya
(74) *Attorney, Agent, or Firm* — Hauptman Ham, LLP (57) ABSTRACT

A circuit test structure includes an interposer for electrically connecting to a chip, wherein the interposer includes a conductive line, and the conductive line extends along at least two side of the interposer. The circuit test structure further includes a plurality of electrical connections to the conductive line. The circuit test structure further includes a testing site electrically connected to the conductive line, wherein the testing site is on an opposite surface of the interposer from the plurality of electrical connections.

20 Claims, 9 Drawing Sheets

Related U.S. Application Data continuation of application No. 15/633,136, filed on Jun. 26, 2017, now Pat. No. 10,288,676, which is a continuation of application No. 14/700,822, filed on Apr. 30, 2015, now Pat. No. 9,689,914, which is a division of application No. 13/356,243, filed on Jan. 23, 2012, now Pat. No. 9,040,986.

(51) Int. Cl.
*H01L 23/498* (2006.01)
*H01L 21/66* (2006.01)
*G01R 31/28* (2006.01)

(56) References Cited

U.S. PATENT DOCUMENTS

| | | |
|---|---|---|
| 6,383,827 B1 | 5/2002 | Lukanc et al. |
| 7,411,298 B2 | 8/2008 | Kawakami et al. |
| 7,598,523 B2 | 10/2009 | Luo et al. |
| 2003/0164551 A1* | 9/2003 | Lee .............. H01L 21/563 257/E23.079 |
| 2004/0157410 A1 | 8/2004 | Yamaguchi |
| 2004/0193989 A1 | 9/2004 | Welbon et al. |
| 2004/0207078 A1 | 10/2004 | Su |
| 2008/0078994 A1 | 4/2008 | Seshan |
| 2009/0058435 A1 | 3/2009 | Nakamura |
| 2009/0322364 A1 | 12/2009 | Mangrum et al. |
| 2010/0207648 A1 | 8/2010 | Zhu |
| 2010/0264935 A1 | 10/2010 | Erdman et al. |
| 2011/0093224 A1 | 4/2011 | Ide |
| 2011/0298488 A1 | 12/2011 | Stillman et al. |
| 2012/0097944 A1 | 4/2012 | In et al. |
| 2012/0106117 A1 | 5/2012 | Sundaram et al. |
| 2012/0273782 A1 | 11/2012 | Goel et al. |
| 2012/0292759 A1 | 11/2012 | Shikawa |
| 2012/0298410 A1 | 11/2012 | Lu et al. |
| 2012/0305916 A1* | 12/2012 | Liu .............. H01L 23/585 257/E23.151 |
| 2013/0015871 A1 | 1/2013 | Cleary et al. |
| 2013/0147505 A1 | 6/2013 | Wang et al. |
| 2013/0153896 A1 | 6/2013 | Whetsel |

* cited by examiner

CIRCUIT TEST STRUCTURE AND METHOD OF USING

PRIORITY CLAIM

The present application is a continuation of U.S. application Ser. No. 16/401,850, filed May 2, 2019, which is a continuation of U.S. application Ser. No. 15/633,136, filed Jun. 26, 2017, now U.S. patent Ser. No. 15/633,136, issued May 14, 2019, which is a continuation of U.S. application Ser. No. 14/700,822, filed Apr. 30, 2015, now U.S. Pat. No. 9,689,914, issued Jun. 27, 2018, which is a divisional of U.S. application Ser. No. 13/356,243, filed Jan. 23, 2012, now U.S. Pat. No. 9,040,986, issued May 26, 2015, which are incorporated herein by reference in their entireties.

BACKGROUND

Three-dimensional integrated circuits (3DICs) include top chips stacked on a passive interposer. The top chips are electrically connected to the passive interposer through micro solder bumps. In some instances, the passive interposer includes through substrate vias (TSVs) and metal routing layers configured to provide electrical connection from a surface of the passive interposer connected to the top chips and an opposite surface of the passive interposer. In some instances, the opposite surface of the passive interposer is electrically connected to a substrate by solder bumps. In some instances, TSVs are configured to provide electrical connection between a surface of the substrate in contact with the passive interposer and an opposite surface of the substrate.

One way to test the quality of the connection between the top chips and the passive interposer as well as between the passive interposer and the substrate is to form Kelvin structures on the 3DIC. A Kelvin structure includes a group of four testing sites, electrically connected to the micro solder bumps and/or the solder bumps between the passive interposer and the substrate. The Kelvin structure is arranged to test the resistance of solder bumps. By passing a voltage through two of the testing sites of the Kelvin structure and measuring a resulting current in the other two testing sites of the Kelvin structure, a resistance value of the micro solder bumps and/or the solder bumps between the passive interposer and the substrate can be determined. The resistance value provides information regarding whether the micro solder bumps and/or solder bumps provide sufficient electrical connection between the various components of the 3DIC.

DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
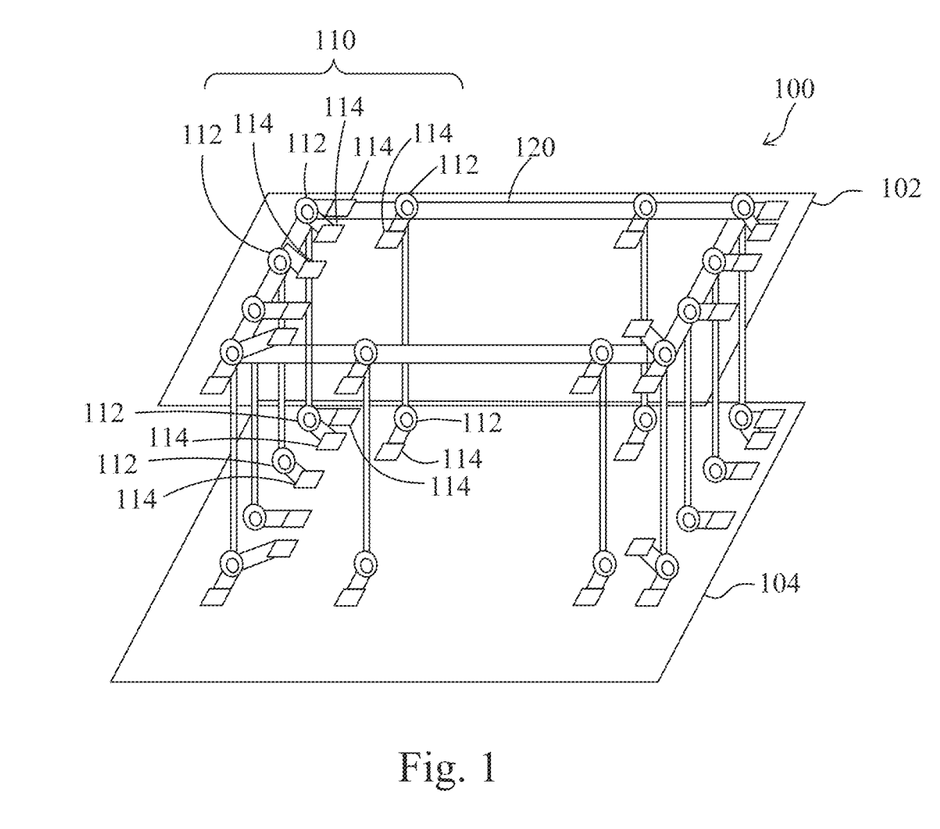
FIG. 1 is a perspective view of a three-dimensional integrated circuit (3DIC) having at least one Kelvin structure, according to one or more embodiments.

FIG. 1 depicts a three-dimensional integrated circuit (3DIC) 100 including at least one Kelvin structure 110. 3DIC 100 includes a top chip 102 over an interposer 104. Top chip 102 includes a conductive line 120. Conductive line 120 is a continuous line extending around a perimeter of top chip 102 and positioned parallel to the exterior edges of top chip 102. Conductive line 120 is spaced a predefined distance from the exterior edge of top chip 102. Conductive line 120 is electrically connected to connectors 112. Connectors 112 are positioned between top chip 102 and interposer 104 and configured to provide electrical connection between top chip 102 and interposer 104. Testing sites 114 positioned on each of top chip 102 and interposer 104 and are electrically connected to connectors 112 on each of top chip 102 and interposer 104.

Top chip 102 includes active devices such as transistors or other suitable circuitry. In some embodiments, 3DIC 100 includes one top chip 102. In some embodiments, 3DIC 100 includes more than one top chip 102. In some embodiments, top chip 102 is an integrated circuit. In some embodiments, top chip 102 is a high speed integrated circuit. In some embodiments having more than one top chip 102, a Kelvin structure is formed on each top chip 102. In some embodiments having more than one top chip 102, a Kelvin structure is formed on only one top chip 102.

Interposer 104 is configured to electrically connect to top chip 102. Interposer 104 contains conductive routing layers and vias configured to transfer signals within interposer 104. In some embodiments having more than one top chip 102, interposer 104 is configured to electrically connect each top chip 102. In some embodiments, interposer 104 is configured to transfer signals between top chips 102. In some embodiments, interposer 104 is electrically connected to a substrate.

In some embodiments, interposer 104 comprises a dielectric material such as silicon dioxide or a low k dielectric material. A low k dielectric material is a dielectric material having a dielectric constant, k, below 3.5 such as fluorine doped silicon dioxide, carbon doped silicon dioxide, aerogel or other suitable dielectric material. The dielectric material provides electrical isolation between the routing layers and vias of interposer 104 to reduce the risk of short circuits.

Connectors 112 are configured to provide electrical connection between top chip 102 and interposer 104. In some embodiments, connectors 112 comprise a solder material. In some embodiments, the solder material is a lead free solder. In some embodiments, the solder material comprises tin and silver. In some embodiments, connectors 112 are configured to attach to top chip 102 through bump pad structures on a back surface of top chip 102. In some embodiments, connectors 112 are configured to attach to top chip 102 through copper pillar structures on the back surface of top chip 102. In some embodiments, connectors 112 are configured to attach to interposer 104 through bump pad structures on a front surface of interposer 104. In some embodiments, connectors 112 are configured to attach to interposer 104 through copper pillar structures on the front surface of interposer 104. In some embodiments, a spacing between adjacent connectors 112 ranges from 30 µm to 50 µm.

Testing sites 114 are configured to electrically connect to connectors 112 on top chip 102 and interposer 104. That is, for each connector 112 on top chip 102, a testing site 114 positioned on top chip 102 is configured to electrically connect to the connector 112 and for each connector 112 or interposer 104, a testing site 114 positioned on interposer 104 is configured to electrically connect to the connector 112. In some embodiments, testing sites 114 comprise a conductive pad. In some embodiments, testing sites 114 comprise a through substrate via (TSV). In some embodiments, testing sites 114 comprise copper, aluminum, nickel, titanium, alloys or other suitable conductive material.

Conductive line 120 is configured to electrically connect to connectors 112 on top chip 102. Conductive line 120 is a continuous conductive element extending parallel to the exterior edges of top chip 102 and set back from the exterior edges by a predefined distance. Conductive line 120 is configured to permit current and voltage to travel between connectors 112. In some embodiments, conductive line 120 comprises copper, aluminum, nickel, titanium, alloys or other suitable conductive materials. In the embodiment of FIG. 1, conductive line 120 is formed only on top chip 102. In some embodiments, both top chip 102 and interposer 104 include conductive line 120. Conductive line 120 on interposer 104 is positioned in substantially the same manner as conductive line 120 on top chip 102.

In some embodiments, conductive line 120 is a sealing ring formed on top chip 102. The sealing ring is a metal ring formed between elements of 3DIC 100 to prevent moisture or debris from entering an interior portion of the circuit layers. Moisture and debris increase the likelihood of short circuits in the circuit layers. In some embodiments, conductive line 120 on top chip 102 is separate from the sealing ring. In some embodiments, conductive line 120 is a sealing ring formed on interposer 104. In some embodiments, conductive line on interposer 104 is separate from the sealing ring. In some embodiments, conductive line 120 on one of top chip 102 or interposer 104 is the sealing ring and conductive line 120 on the other of top chip 102 and interposer 104 is separate from the sealing ring. In an embodiment in which the conductive line 120 is separate from the sealing ring, conductive line 120 is displaced from the sealing ring toward an interior portion of top chip 102 or interposer 104.

Figure 2:
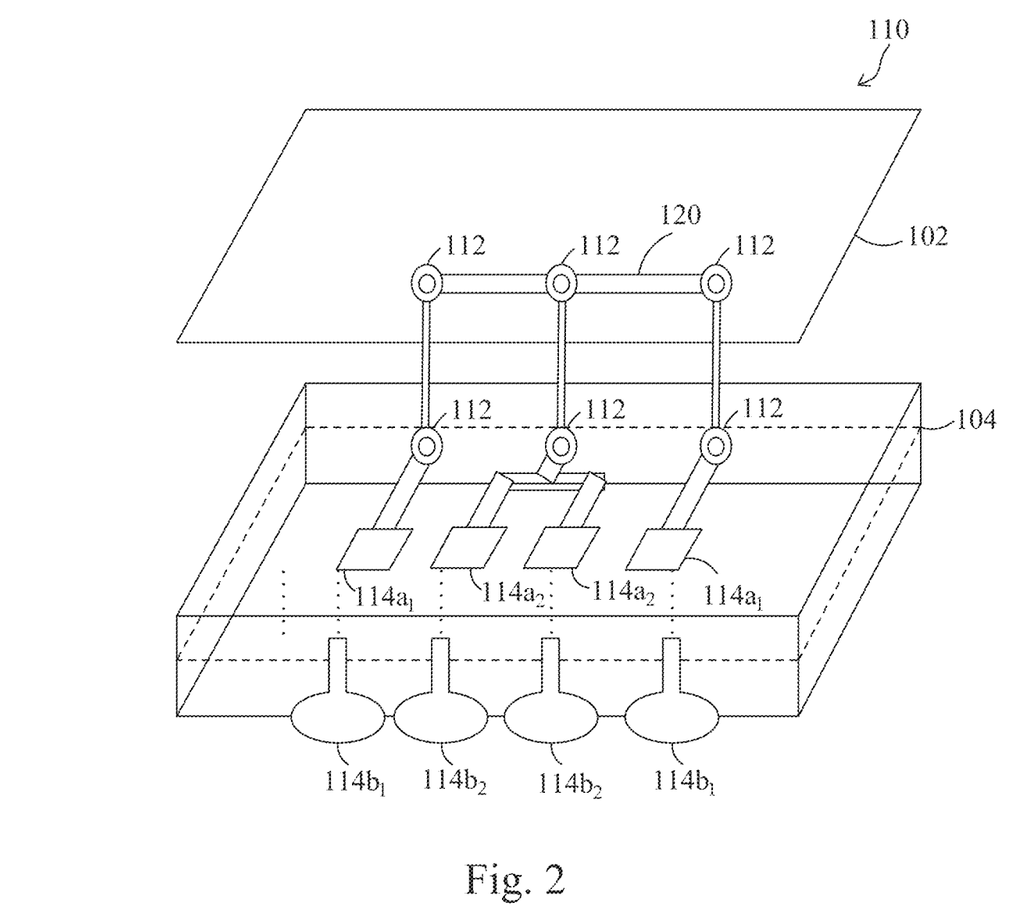
FIG. 2 is perspective view of a Kelvin structure, according to one or more embodiments.

FIG. 2 depicts an example Kelvin structure 110. In some embodiments, a group of connectors 112 and testing sites 114 collective form a Kelvin structure 110. FIG. 2 depicts top chip 102 and interposer 104 electrically connected by connectors 112. FIG. 2 further depicts testing sites $114a_1$, $114a_2$, $114b_1$ and $114b_2$ on interposer 104. Testing sites $114a_1$ and $114a_2$ are conductive pads and testing sites $114b_1$ and $114b_2$ are TSVs. Connectors 112 on top chip 102 are configured to be electrically connected by conductive line 120.

By applying a voltage to one of testing sites $114a_1$ and one of testing sites $114a_2$ and measuring a current between the other of testing sites $114a_1$ and the other of testing sites $114a_2$, a resistance of the connectors 112 and conductive line 120 is determined. If a substantially zero resistance is determined, then a short circuit is likely present. If a substantially infinite resistance is determined, then connectors 112 likely failed to provide sufficient electrical connection between top chip 102 and interposer 104. If the determined resistance substantially equals a resistance calculated from the known materials of the connectors 112, testing sites $114a_1$, $114a_2$, $114b_1$ and $114b_2$, and conductive line 120, then connectors 112 provide sufficient electrical connection between top chip 102 and interposer 104.

In some embodiments, top chip 102 is substantially rectangular having one Kelvin structure 110 at each of the four corners of top chip 102, as shown in FIG. 1. In some embodiments, top chip 102 has a different shape. In some embodiments, top chip 102 has at least one Kelvin structure 110 at each corner of top chip 102. In some embodiments, top chip 102 has at least one Kelvin structure 110 at each corner of top chip 102 and at an additional location along at least one side of top chip 102.

Because conductive line 120 is configured to electrically connect each of connectors 112, Kelvin structure 110 on 3DIC 100 facilitates measuring whether top chip 102 is damaged during a bonding process. In some embodiments, a bonding process to connect top chip 102 to interposer 104 involves pressing top chip 102 and interposer 104 together. If the force exerted during the bonding process exceeds the mechanical strength of top chip 102, top chip 102 can warp or fracture. In some embodiments, the warping or fracture of top chip 102 results in a breaking or bending in conductive line 120. The breaking or bending of conductive line 120 increases the resistance of conductive line 120. The increased resistance is detectable by applying a voltage to testing sites 114 and measuring a current resulting from the applied voltage. By connecting conductive line 120 to connectors 112, 3DIC is testable to determine warping or fracturing of top chip 102 and the existence of sufficient electrical connection between top chip 102 and interposer 104.

In some embodiments, the resistance of conductive line 120 and connectors 112 is measured following the completion of the bonding process. In some embodiments, the resistance of conductive line 120 and connectors 112 is measured during the bonding process. Measuring the resistance during the bonding process provides information regarding when top chip 102 and interposer 104 are sufficiently electrically connected. Stopping the bonding process when top chip 102 and interposer 104 are sufficiently electrically connected avoids the exertion of unnecessary force on top chip 102 and interposer 104, reducing the likelihood of warping or fracture.

Figure 3:
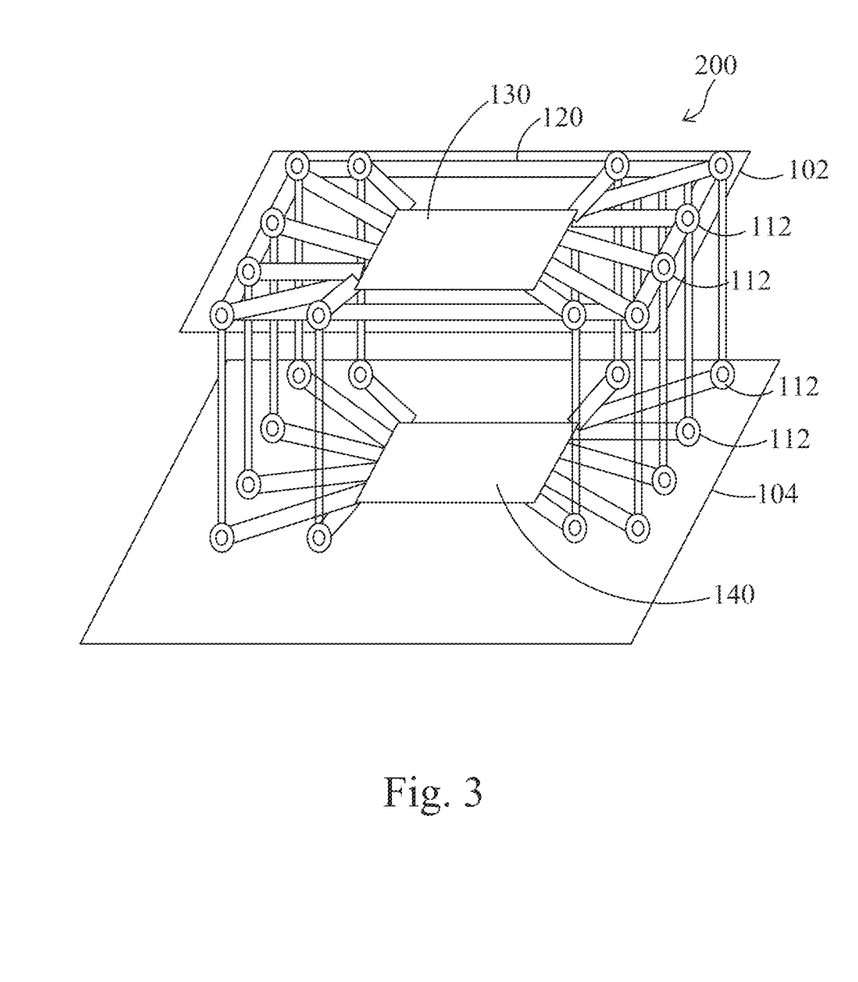
FIG. 3 is a perspective view of a 3DIC having at least one test circuit, according to one or more embodiments.

FIG. 3 depicts a 3DIC 200 including top chip 102 and interposer 104. 3DIC 200 also includes connectors 112 configured to electrically connect top chip 102 and interposer 104. Conductive line 120 is positioned on top chip 102 and is configured to electrically connect connectors 112 on top chip 102. 3DIC 200 also includes a test circuit 130 on top chip 102 and a test circuit 140 on interposer 104. Test circuit 130 is configured to electrically connect to each of connectors 112 on top chip 102. Test circuit 140 is configured to electrically connect to each of connectors 112 on interposer 104.

In some embodiments, the materials, shape and composition of top chip 102, interposer 104, connectors 112 and conductive line 120 for 3DIC 200 are substantially the same as 3DIC 100.

Test circuit 130 is configured to determine the resistance between connectors 112 on top chip 102. In some embodiments, a probe is connected to test circuit 130 to supply a testing voltage to connectors 112 and measure the resulting voltage. In some embodiments, test circuit 130 is configured to connect to a supply voltage of top chip 102. In some embodiments, test circuit 130 includes a voltage supplying unit configured to supply a testing voltage. In some embodiments, test circuit 130 is configured to provide an alert when the resistance between connectors 112 is outside a predetermined range. In this manner test circuit 130 determines whether top chip 102 is warped or fractured.

In some embodiments, connectors 112 on interposer 104 are electrically connected through test circuit 140. If connectors 112 on interposer 104 are electrically connected through test circuit 140, test circuit 130 can measure the resistance between connectors 112 on top chip 102 and connectors 112 on interposer 104. The measured resistance between connectors 112 on top chip 102 and connectors 112 on interposer 104 helps a manufacturer determine whether connectors 112 provide sufficient electrical connection between top chip 102 and interposer 104.

In some embodiments, connectors 112 on interposer 104 are not electrically connected through test circuit 140. If connectors 112 on interposer 104 are not electrically connected through test circuit 140, test circuit 130 cannot measure the resistance between connectors 112 on top chip 102 and connectors 112 on interposer 104. Test circuit 140 is configured to measure the resistance between connectors 112 on top chip 102 and connectors 112 on interposer 104. In some embodiments, test circuit 140 is substantially the same as test circuit 130.

Figure 4:
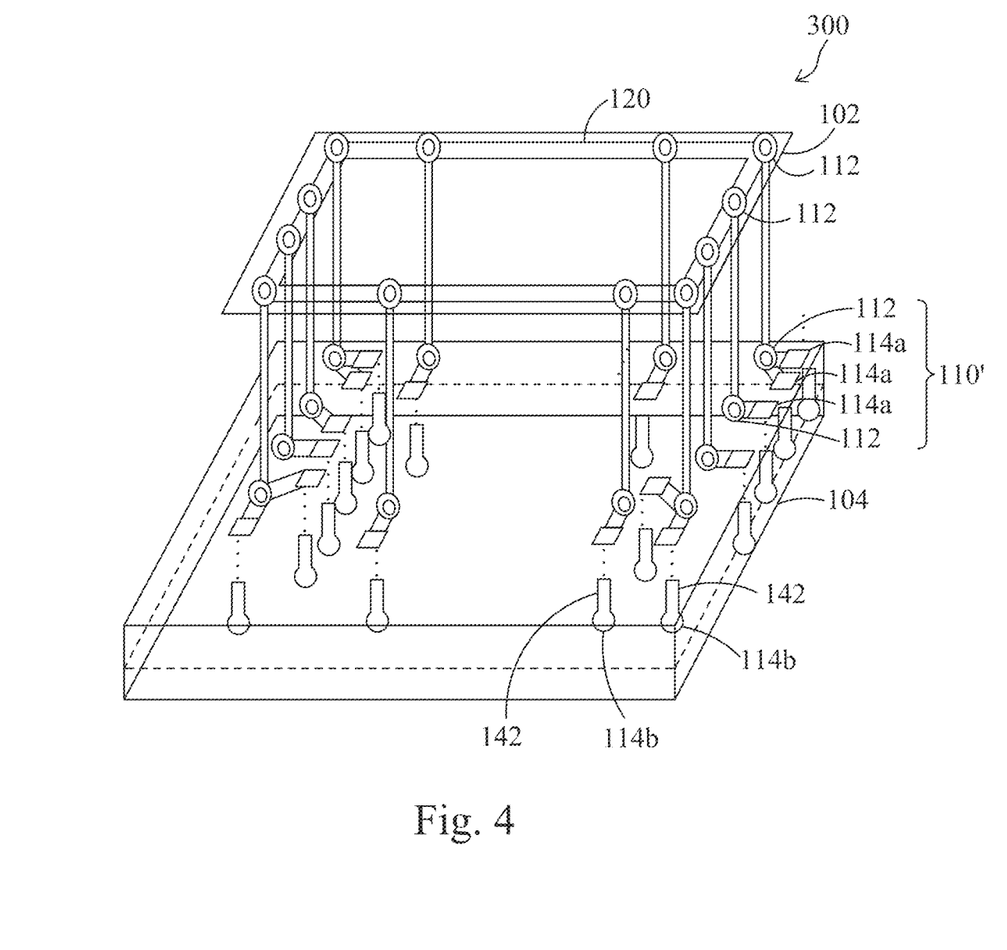
FIG. 4 is a perspective view of a 3DIC having at least one Kelvin structure and through substrate vias (TSVs), according to one or more embodiments.

FIG. 4 depicts a 3DIC 300 including top chip 102 and interposer 104. 3DIC 300 also includes connectors 112 configured to electrically connect top chip 102 and interposer 104. Conductive line 120 positioned on top chip 102 is configured to electrically connect connectors 112 on top chip 102. 3DIC 300 also includes testing sites 114a and 114b on interposer 104. Testing sites 114a and 114b are configured to electrically connect to connectors 112 on interposer 104. Testing sites 114a are on a front surface of interposer 104. Testing sites 114b are on a back surface of interposer 104 opposite the front surface. Testing sites 114b are configured to electrically connect to testing sites 114a by TSVs 142.

In some embodiments, the materials, shape and composition of top chip 102, interposer 104, connectors 112 and conductive line 120 for 3DIC 300 are substantially the same as 3DIC 100.

In some embodiments, testing sites 114a allow detection of the resistance of connectors 112 and conductive line 120 in a manner substantially the same as testing sites 114 in 3DIC 100. In some embodiments, the front surface of interposer 104 is not accessible following the bonding process. Testing sites 114b are configured to electrically connect to testing sites 114a and allow testing of the resistance of connectors 112 and conductive line 120. In a manner similar to 3DIC 100, 3DIC 300 includes a Kelvin structure 110', comprising connectors 112 and testing sites 114a and 114b, in each of the four corners of interposer 104. By applying a voltage to appropriate testing sites 114b and measuring a current at other testing sites 114b, the resistance of connectors 112 and conductive line 120 of 3DIC 300 is determined. The resistance helps the manufacturer determine whether top chip 102 is warped or fractured and whether connectors 112 provide sufficient electrical connection between top chip 102 and interposer 104.

Figure 5:
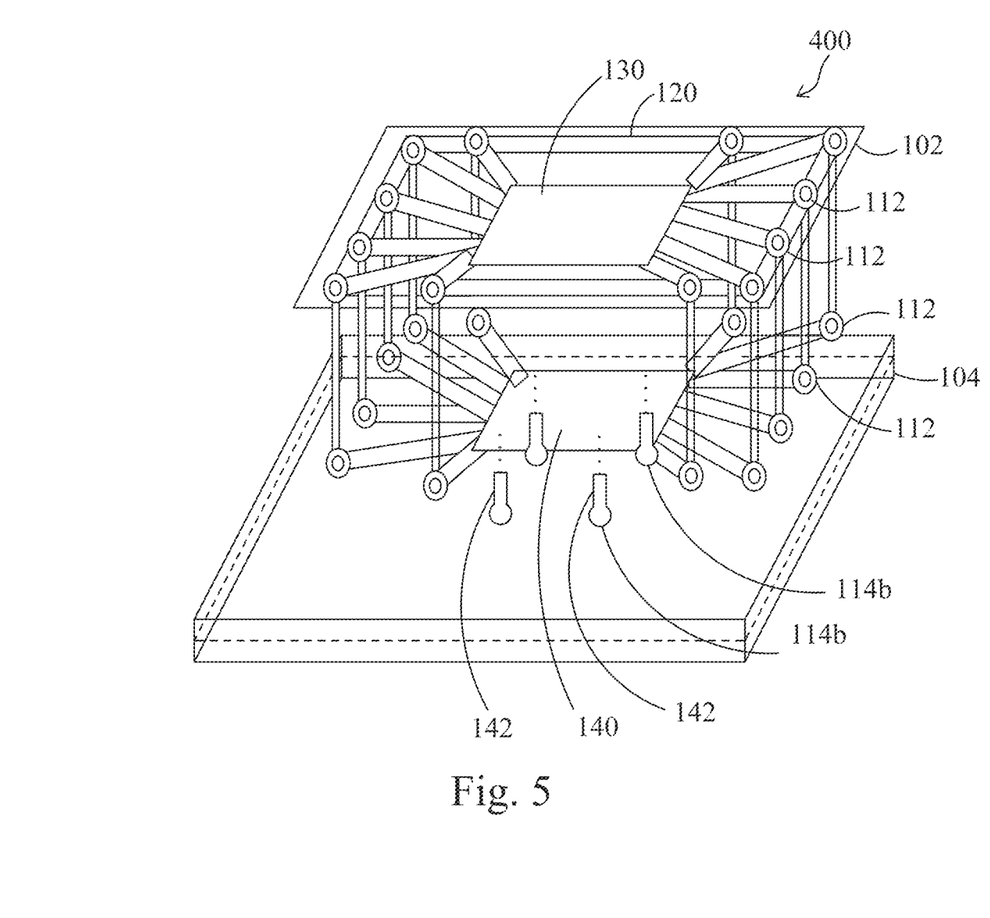
FIG. 5 is a perspective view of a 3DIC having at least one test circuit and TSVs, according to one or more embodiments.

FIG. 5 depicts a 3DIC 400 including top chip 102 and interposer 104. 3DIC 400 also includes connectors 112 configured to electrically connect top chip 102 and interposer 104. Conductive line 120, positioned on top chip 102 is configured to electrically connect connectors 112 on top chip 102. 3DIC 400 also includes a test circuit 130 on top chip 102 and a test circuit 140 on interposer 104. Test circuit 130 is configured to electrically connect to each of connectors 112 on top chip 102. Test circuit 140 is configured to electrically connect to each of connectors 112 on interposer 104. 3DIC 400 also includes testing sites 114b configured to electrically connect to test circuit 140 through TSVs 142.

In some embodiments, the materials, shape and composition of top chip 102, interposer 104, connectors 112 and conductive line 120 for 3DIC 400 are substantially the same 3DIC 100.

In some embodiments, test circuit 140 detects the resistance of connectors 112 and conductive line 120 in a manner substantially the same as test circuit 140 in 3DIC 200. In some embodiments, the front surface of interposer 104 is not accessible following the bonding process. Testing sites 114b are configured to electrically connect to test circuit 140 and allow testing of the resistance of connectors 112 and conductive line 120. In some embodiments, a voltage is supplied to test circuit 140 through testing sites 114b. In some embodiments, test circuit 140 is configured to electrically connect to a supply voltage in top chip 102. In some embodiments, test circuit 140 includes a voltage supply. In some embodiments, test circuits 130 and 140 of 3DIC 400 are substantially the same as test circuits 130 and 140 of 3DIC 200. In a manner substantially the same as test circuit 140 in 3DIC 200, test circuit 140 in 3DIC 400 measures the resistance of connectors 112 and conductive line 120. The resistance helps the manufacturer determine whether top chip 102 is warped or fractured and whether connectors 112 provide sufficient electrical connection between top chip 102 and interposer 104.

Figure 6:
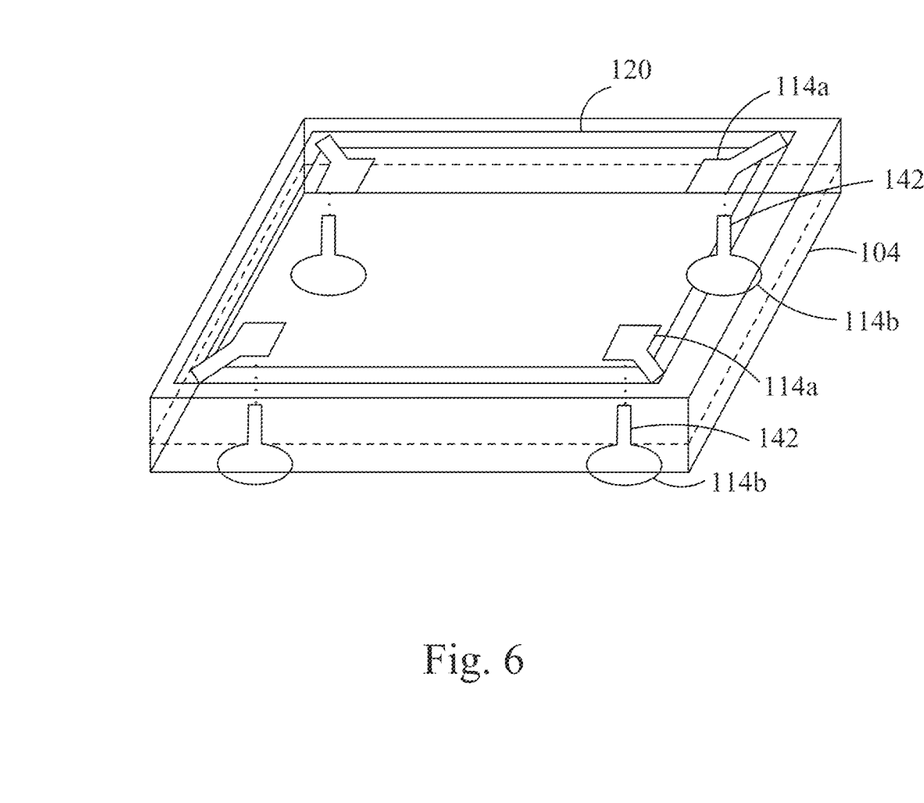
FIG. 6 is a perspective view of an interposer having a conductive line on a front surface of the interposer and TSVs, according to one or more embodiments.

FIG. 6 depicts an interposer 104 including conductive line 120 on the front surface of interposer 104. Interposer 104 further includes testing sites 114a and 114b. Conductive line 120 is configured to electrically connect to testing sites 114a and 114b. Testing sites 114a are on the front surface of interposer 104. Testing sites 114b are on the back surface of interposer 104 and configured to electrically connect to testing sites 114a through TSVs 142.

In the embodiment of FIG. 6, testing sites 114a are located at each corner of interposer 104. In some embodiments, interposer 104 includes additional testing sites 114a and 114b positioned along at least one side between the corners on the front surface of interposer 104. In some embodiments, the front surface of interposer 104 is not accessible following the bonding process. Testing sites 114b are configured to electrically connect to testing sites 114a and allow testing of the resistance of conductive line 120.

If the force exerted during the bonding process exceeds the mechanical strength of interposer 104, interposer 104 can warp or fracture. In some embodiments, the warping or fracture of interposer 104 results in a breaking or bending in conductive line 120. The breaking or bending of conductive line 120 increases the resistance of conductive line 120. The increased resistance is detectable by applying a voltage to testing sites 114a or 114b and measuring a current resulting from the applied voltage. The inclusion of conductive line 120 on interposer 104 makes interposer 104 testable to determine warping or fracturing of interposer 104.

Figure 7:
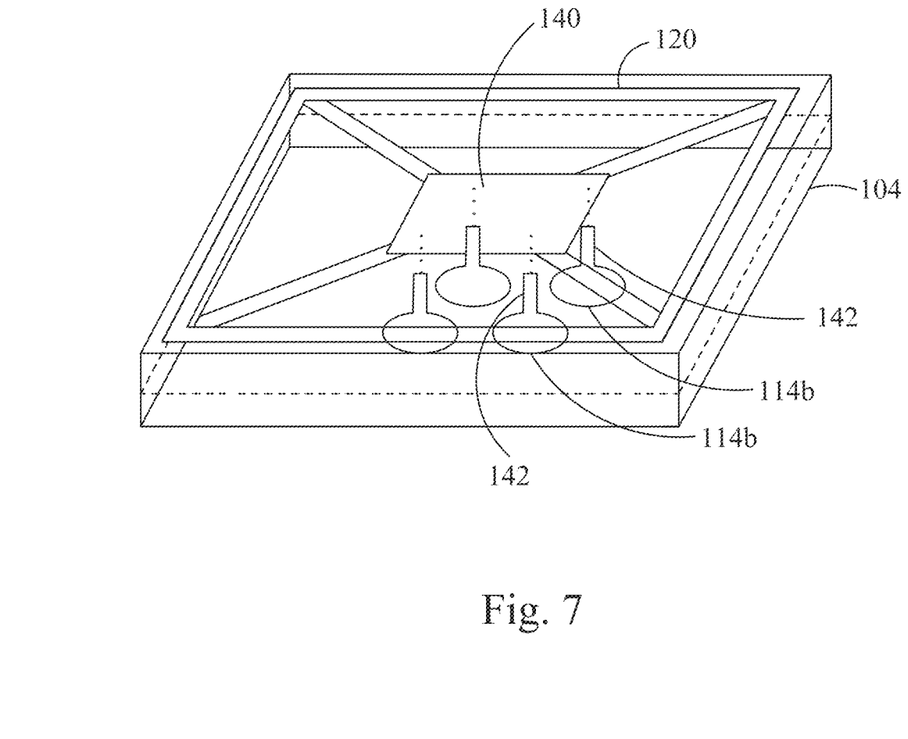
FIG. 7 is a perspective view of an interposer having a test circuit on a front surface of the interposer and TSVs, according to one or more embodiments.

FIG. 7 depicts an interposer 104 including conductive line 120 on the front surface of interposer 104. Interposer 104 further includes test circuit 140 and testing sites 114b. Conductive line 120 is configured to electrically connect to test circuit 140 and testing sites 114b. Test circuit 140 is on the front surface of interposer 104. Testing sites 114b are on the back surface of interposer 104 and configured to electrically connect to test circuit 140 through TSVs 142.

In some embodiments, test circuit 140 detects the resistance of conductive line 120 in a manner substantially similar to test circuit 130 in 3DIC 200. In some embodiments, the front surface of interposer 104 is not accessible following the bonding process. Testing sites 114b are configured to electrically connect to test circuit 140 and allow measurement of the resistance of conductive line 120. In some embodiments, a voltage is supplied to test circuit 140 through testing sites 114b. In some embodiments, test circuit 140 is configured to electrically connect to a supply voltage in top chip 102. In some embodiments, test circuit 140 includes a voltage supply. In a manner substantially the same as test circuit 130 in 3DIC 200, test circuit 140 measures the resistance of conductive line 120. The resistance helps determine whether interposer 104 is warped or fractured.

Figure 8:
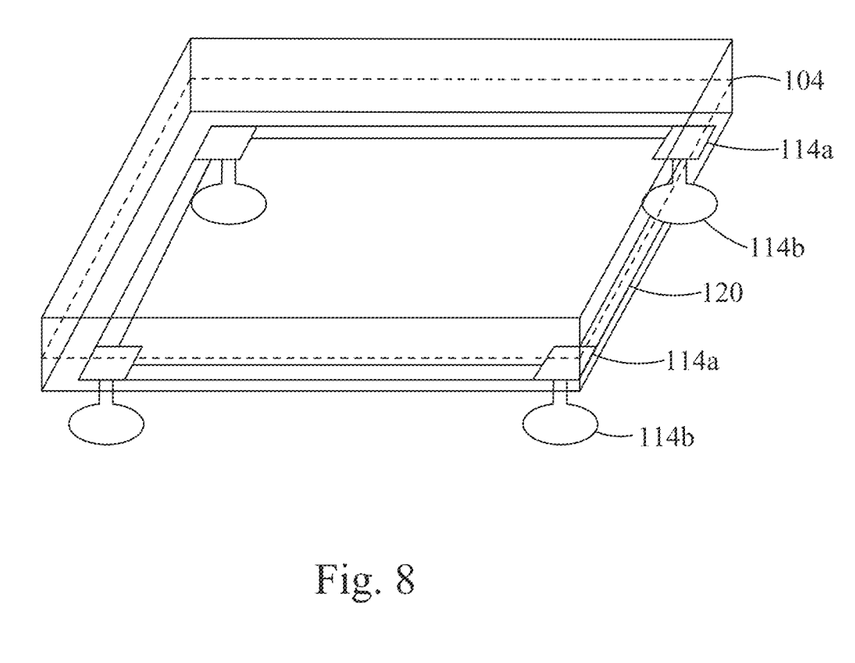
FIG. 8 is a perspective view of an interposer having a conductive line on a back surface of the interposer and TSVs, according to one or more embodiments.

FIG. 8 depicts an interposer 104 including conductive line 120 on the back surface of interposer 104. Interposer 104 further includes testing sites 114a and 114b. Conductive line 120 is configured to electrically connect to testing sites 114a and 114b. Testing sites 114a are on the back surface of interposer 104. Testing sites 114b are on the back surface of interposer 104 and configured to electrically connect to testing sites 114a.

In the embodiment of FIG. 8, testing sites 114a are located at each corner of interposer 104. In some embodiments, interposer 104 includes additional testing sites 114a and 114b positioned along at least one side between the corners on the back surface interposer 104.

In some embodiments, a substrate is bonded to the back surface of interposer 104. Following, the boding of the substrate to the back surface of interposer 104, the back surface of interposer 104 is no longer accessible, in some embodiments. Testing sites 114b are configured to electrically connect to testing sites 114a and allow measurement of the resistance of conductive line 120.

If the force exerted during the bonding process exceeds the mechanical strength of interposer 104, interposer 104 can warp or fracture. In some embodiments, the warping or fracture of interposer 104 results in a breaking or bending in conductive line 120. The breaking or bending of conductive line 120 increases the resistance of conductive line 120. The increased resistance is detectable by applying a voltage to testing sites 114a or 114b and measuring a current resulting from the applied voltage. The inclusion of conductive line 120 on interposer 104 makes interposer 104 testable to determine warping or fracturing of interposer 104.

Figure 9:
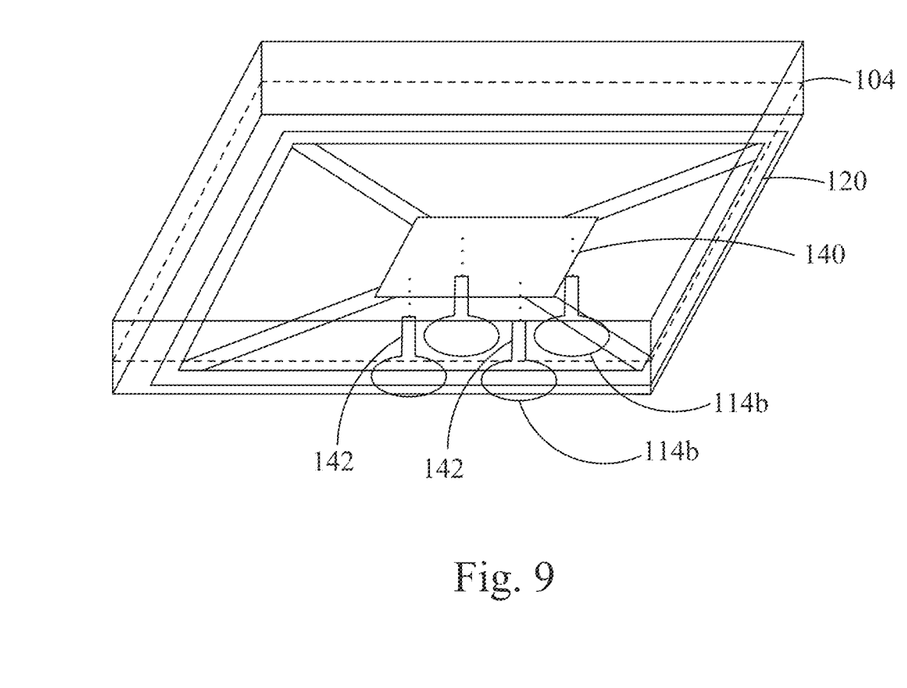
FIG. 9 is a perspective view of an interposer having a test circuit on a back surface of the interposer and TSVs, according to one or more embodiments.

FIG. 9 depicts an interposer 104 including conductive line 120 on the back surface of interposer 104. Interposer 104 further includes test circuit 140 and testing sites 114b. Conductive line 120 is configured to electrically connect to test circuit 140 and testing sites 114b. Test circuit 140 is on the back surface of interposer 104. Testing sites 114b are on the back surface of interposer 104 and configured to electrically connect to test circuit 140 through TSVs 142.

In some embodiments, a substrate is bonded to the back surface of interposer 104. Following, the boding of the substrate to the back surface of interposer 104, the back surface of interposer 104 is no longer accessible, in some embodiments. Testing sites 114b are configured to electrically connect to test circuit 140 and allow testing of the resistance of conductive line 120.

In some embodiments, test circuit 140 detects the resistance of conductive line 120 in a manner substantially similar to test circuit 130 in 3DIC 200. In some embodiments, a voltage is supplied to test circuit 140 through testing sites 114b. In some embodiments, test circuit 140 is configured to electrically connect to a supply voltage in top chip 102. In some embodiments, test circuit 140 includes a voltage supply. In a manner substantially the same as test circuit 130 in 3DIC 200, test circuit 140 measures the resistance of conductive line 120. The resistance helps the manufacturer determine whether interposer 104 is warped or fractured.

An aspect of this description relates to a circuit test structure. The circuit test structure includes an interposer for electrically connecting to a chip, wherein the interposer includes a conductive line, and the conductive line extends along at least two side of the interposer. The circuit test structure further includes a plurality of electrical connections to the conductive line. The circuit test structure further includes a testing site electrically connected to the conductive line, wherein the testing site is on an opposite surface of the interposer from the plurality of electrical connections. In some embodiments, each of the plurality of electrical connections is at a corresponding corner of the interposer. In some embodiments, each of the plurality of electrical connections is on a same surface of the interposer as the conductive line. In some embodiments, the circuit test structure further includes a second testing site on a same surface of the interposer as the conductive line. In some embodiments, the second testing site is electrically connected to the testing site. In some embodiments, the testing site is one of a plurality of first testing sites, and each of the plurality of first testing sites is electrically connected to a corresponding electrical connection of the plurality of electrical connections. In some embodiments, the circuit test structure further includes a plurality of second testing sites, wherein each of the plurality of second testing sites is electrically connected to a corresponding electrical connection of the plurality of electrical connections. In some embodiments, each of the plurality of second testing sites is electrically connected to a corresponding first testing site of the plurality of first testing sites.

An aspect of this description relates to a circuit test structure. The circuit test structure includes an interposer for electrically connecting to a chip, wherein the interposer includes a conductive line, and the conductive line traces a perimeter of the interposer. The circuit test structure further includes a test circuit connected to the conductive line. The circuit test structure further includes a testing site electrically connected to the test circuit, wherein the testing site is physically separated from the test circuit. In some embodiments, the testing site is one of a plurality of testing sites, and each of the plurality of testing sites is electrically connected to the test circuit. In some embodiments, each of the plurality of testing sites is physically separated from the test circuit. In some embodiments, the test circuit is on a same surface of the interposer as the conductive line. In some embodiments, the test circuit is electrically connected to the conductive line at multiple locations on the conductive line. In some embodiments, the testing site is on a opposite surface of the interposer from the test circuit.

An aspect of this description relates to a method. The method includes applying a voltage to a first testing site of a plurality of testing sites connected to a conductive line, wherein the at least one conductive line is along at least two sides of an interposer. The method further includes measuring a current responsive to the applied voltage. The method further includes determining an integrity of a three-dimension integrated circuit (3DIC) based on a comparison of a resistance determined from the measured current and a calculated resistance based on the first testing site and the conductive line. In some embodiments, measuring the current includes measuring the current using a second testing site of the plurality of testing sites. In some embodiments, measuring the current includes using the second testing site on an opposite surface of the interposer from the first testing site. In some embodiments, measuring the current includes using the second testing site on a same surface of the interposer as the first testing site. In some embodiments, measuring the current includes measuring the current using a test circuit. In some embodiments, measuring the current includes using the test circuit on an opposite surface of the interposer from the first testing site.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A circuit test structure comprising:
    an interposer for electrically connecting to a chip, wherein the interposer includes a conductive line, and the conductive line extends along at least two side of the interposer;
    a plurality of electrical connections to the conductive line, wherein each of the plurality of electrical connections is at a corresponding corner of the interposer; and
    a testing site electrically connected to the conductive line, wherein the testing site is on an opposite surface of the interposer from the plurality of electrical connections.

2. The circuit test structure of claim 1, wherein the testing site is at a corner of the interposer.

3. The circuit test structure of claim 1, wherein each of the plurality of electrical connections is on a same surface of the interposer as the conductive line.

4. The circuit test structure of claim 1, further comprising a second testing site on a same surface of the interposer as the conductive line.

5. The circuit test structure of claim 4, wherein the second testing site is electrically connected to the testing site.

6. The circuit test structure of claim 1, wherein the testing site is one of a plurality of first testing sites, and each of the plurality of first testing sites is electrically connected to a corresponding electrical connection of the plurality of electrical connections.

7. The circuit test structure of claim 6, further comprising a plurality of second testing sites, wherein each of the plurality of second testing sites is electrically connected to a corresponding electrical connection of the plurality of electrical connections.

8. The circuit test structure of claim 7, wherein each of the plurality of second testing sites is electrically connected to a corresponding first testing site of the plurality of first testing sites.

9. A circuit test structure comprising:
    an interposer for electrically connecting to a chip, wherein the interposer includes a conductive line, and the conductive line traces a perimeter of the interposer;
    a test circuit connected to the conductive line; and
    a testing site electrically connected to the test circuit, wherein the testing site is physically separated from the test circuit.

10. The circuit test structure of claim 9, wherein the testing site is one of a plurality of testing sites, and each of the plurality of testing sites is electrically connected to the test circuit.

11. The circuit test structure of claim 10, wherein each of the plurality of testing sites is physically separated from the test circuit.

12. The circuit test structure of claim 9, wherein the test circuit is on a same surface of the interposer as the conductive line.

13. The circuit test structure of claim 9, wherein the test circuit is electrically connected to the conductive line at multiple locations on the conductive line.

14. The circuit test structure of claim 9, wherein the testing site is on a opposite surface of the interposer from the test circuit.

15. A method comprising:
    applying a voltage to a first testing site of a plurality of testing sites connected to a conductive line, wherein the at least one conductive line is along at least two sides of an interposer;
    measuring a current responsive to the applied voltage; and
    determining an integrity of a three-dimension integrated circuit (3DIC) based on a comparison of a resistance determined from the measured current and a calculated resistance based on the first testing site and the conductive line.

16. The method of claim 15, wherein measuring the current comprises measuring the current using a second testing site of the plurality of testing sites.

17. The method of claim 16, wherein measuring the current comprises using the second testing site on an opposite surface of the interposer from the first testing site.

18. The method of claim 16, wherein measuring the current comprises using the second testing site on a same surface of the interposer as the first testing site.

19. The method of claim 15, wherein measuring the current comprises measuring the current using a test circuit.

20. The method of claim 19, wherein measuring the current comprises using the test circuit on an opposite surface of the interposer from the first testing site.

* * * * *